US006887736B2

(12) United States Patent
Nause et al.

(10) Patent No.: US 6,887,736 B2
(45) Date of Patent: May 3, 2005

(54) METHOD OF FORMING A P-TYPE GROUP II-VI SEMICONDUCTOR CRYSTAL LAYER ON A SUBSTRATE

(75) Inventors: Jeffrey E. Nause, Mableton, GA (US); Joseph Owen Maciejewski, Mableton, GA (US); Vincente Munne, Norcross, GA (US); Shanthi Ganesan, Smyrna, GA (US)

(73) Assignee: Cermet, Inc., Atlanta, GA (US)

( * ) Notice: Subject to any disclaimer, the term of this patent is extended or adjusted under 35 U.S.C. 154(b) by 10 days.

(21) Appl. No.: 10/422,568

(22) Filed: Apr. 23, 2003

(65) Prior Publication Data

US 2004/0058463 A1 Mar. 25, 2004

Related U.S. Application Data (60) Provisional application No. 60/391,507, filed on Jun. 24, 2002.

(51) Int. Cl.[7] .................. H01L 21/04; H01L 21/205
(52) U.S. Cl. .................. 438/104; 438/503; 438/505; 438/509
(58) Field of Search ................ 438/478, 479, 438/22, 47, 48, 104, 4, 46, 503–509

(56) References Cited

U.S. PATENT DOCUMENTS

| 4,272,754 A | | 6/1981 | Lou |
| 4,358,950 A | | 11/1982 | Chang |
| 4,358,951 A | | 11/1982 | Chang |
| 4,568,397 A | | 2/1986 | Hoke et al. |
| 4,612,411 A | * | 9/1986 | Wieting et al. ............ 136/265 |
| 4,876,984 A | | 10/1989 | Kinoshita et al. |
| 4,881,979 A | * | 11/1989 | Lewis ....................... 136/249 |
| 5,157,136 A | * | 10/1992 | Arnold et al. ................ 556/9 |
| 5,369,290 A | * | 11/1994 | Kawasaki et al. .......... 257/103 |
| 5,413,959 A | | 5/1995 | Yamamoto et al. |
| 5,458,085 A | * | 10/1995 | Kondo et al. ............. 148/33.6 |
| 5,468,678 A | | 11/1995 | Nakamura et al. |
| 5,603,778 A | | 2/1997 | Sonoda |
| 5,668,395 A | * | 9/1997 | Razeghi ..................... 257/441 |
| 5,769,963 A | * | 6/1998 | Fujioka et al. ............. 136/258 |
| 5,804,466 A | | 9/1998 | Arao et al. |
| 5,863,326 A | | 1/1999 | Nause et al. |
| 5,882,805 A | * | 3/1999 | Higa et al. .................. 428/689 |
| 5,897,332 A | * | 4/1999 | Hori et al. ................... 438/61 |
| 5,900,060 A | | 5/1999 | Nause et al. |

(Continued)

OTHER PUBLICATIONS

Minegishi et al, Growth of p–type Zinc Oxide Films by Chemical Vapor Depositions Article, Nov. 1, 1997, L 1453–L 1455, vol. 36, Department of Electrical Engineering and Computer Science, Yamanashi University, 4 Takeda, Kofu 400, Japan.

Yamamoto et al, Solution Using a Codoping Method to Unipolarity for the Fabrication of p–Type ZnO, Article, Feb. 15, 1999, L 166 –L 169, vol. 38, Japanese Journal of Applied Physics, Japan.

(Continued)

Primary Examiner—Michael Lebentritt
(74) Attorney, Agent, or Firm—Alston & Bird LLP (57) ABSTRACT

A method of depositing a p-type magnesium-, cadmium- and/or zinc-oxide-based II-VI Group compound semiconductor crystal layer over a substrate by a metalorganic chemical vapor deposition technique. A reaction gas is supplied to a surface of a heated substrate in a direction parallel or oblique to the substrate. The p-type magnesium-, cadmium- and/or zinc-oxide-based II-VI Group compound semiconductor crystal layer is grown on the heated substrate, while introducing a pressing gas substantially in a vertical direction toward the substrate to press the reaction gas against the entire surface of the substrate.

28 Claims, 2 Drawing Sheets

U.S. PATENT DOCUMENTS

| | | | |
|---|---|---|---|
| 6,045,626 A | | 4/2000 | Yano et al. |
| 6,057,561 A | * | 5/2000 | Kawasaki et al. ............. 257/94 |
| 6,147,747 A | | 11/2000 | Kavaya et al. |
| 6,181,723 B1 | * | 1/2001 | Okubo et al. .................. 372/45 |
| 6,261,862 B1 | * | 7/2001 | Hori et al. ..................... 438/96 |
| 6,291,085 B1 | | 9/2001 | White et al. |
| 6,329,216 B1 | * | 12/2001 | Matsumoto et al. .......... 438/47 |
| 6,342,313 B1 | | 1/2002 | White et al. |
| 6,407,405 B1 | | 6/2002 | Sano et al. |
| 6,410,162 B1 | | 6/2002 | White et al. |
| 6,472,241 B2 | | 10/2002 | Iwata et al. |
| 6,475,825 B2 | * | 11/2002 | White et al. ................ 438/104 |
| 6,479,801 B1 | | 11/2002 | Shigeoka et al. |
| 6,491,884 B1 | * | 12/2002 | Faller et al. ................ 423/210 |
| 6,506,994 B2 | | 1/2003 | Wang et al. |
| 6,509,555 B1 | | 1/2003 | Riess et al. |
| 6,521,550 B2 | | 2/2003 | Tanabe et al. |
| 6,524,428 B2 | | 2/2003 | Tamura et al. |
| 6,527,858 B1 | | 3/2003 | Yoshida et al. |
| 6,528,431 B2 | | 3/2003 | Tanabe et al. |
| 6,531,408 B2 | | 3/2003 | Iwata et al. |
| 6,559,736 B2 | * | 5/2003 | Lu et al. ...................... 333/152 |
| 6,620,709 B2 | * | 9/2003 | Kapolnek et al. ........... 438/478 |
| 6,621,192 B2 | * | 9/2003 | Lu et al. .................. 310/313 A |
| 6,673,478 B2 | * | 1/2004 | Kato et al. ................... 428/698 |
| 2002/0028571 A1 | | 3/2002 | Cheung |
| 2003/0011047 A1 | | 1/2003 | Cunningham et al. |

OTHER PUBLICATIONS

Amano et al, Metalorganic Vapor Phase Epitaxial Growth of a High Quality GaN Film Using an AlN Buffer Layer, Article, Feb. 3, 1986, 353 –355, vol. 48, American Institute of Physics, Japan.

Hashimoto, "Effects of hydrogen in an ambient on the crystal growth . . . ", Journal of Crystal Growth 68, (1984), pps. 163–168.

Woelk & Beneking, "A novel movpe reactor with a rotating substrate", Journal of Crystal Growth 93, (1988), pps. 216–219.

Goodings et al, "A new inlet area design for horizontal movpe reactors", Journal of Crystal Growth 96, (1989), pps. 13–18.

Zembutsu & Sasaki, "Growth of GaN crystal films using electron cyclotron resonance plasma excited metalorganic vapor phase epitaxy", Appl. Phys. Lett. 48, (13), Mar. 13, 1986, pps. 870–872.

*Ohki et al, "Fabrication and properties of a practical blue–emitting GaN m–I–s diode," Ins. Phys. Conf. Ser. No. 63, Chapter 10, Paper presented at Int Symp. GaAs and Related compounds, Japan 1981.

Jianhua Hu and Roy G. Gordon, "Atmospheric pressure chemical vapor deposition of gallium doped zinc oxide thin films from diethyl zinc, water, and triethyl gallium," J. Appl. Phys. vol. 72, No. 11, Dec. 1, 1992, pp. 5381–5392.

G.S. Tompa, Y. Li, D. Bingaman, M. Migliuolo and J. Doyle, "ZnO: MOCVD processing and material applications," Materials Technology ZnOpaper.doc, Feb. 11, 1997, pp. 1–17, Piscataway, NJ.

G.S. Tompa, L.G. Provost, and J. Cuchiaro, "Metal Organic Chemical Vapor Deposition of Oxide Films for Advanced Applications," Transparent Conductive Oxides, Jun. 19–20, 2000, pp. 1–12, Denver, Co.

C.R. Gorla, N.W. Emanetoglu, S. Liang, W.E. Mayo, and Y. Lu, "Structural, optical, and surface acoustic wave properties of epitaxial ZnO films grown on (0112) sapphire by metalorganic chemical vapor deposition," Journal of Applied Physics, vol. 85, No. 5, Mar. 1, 1999, pp. 2595–2602, Piscataway, NJ.

Y. Liu, C.R. Gorla, S. Liang, N. Emanetoglu, Y. Lu, H. Shen, and M. Wraback, "Ultraviolet Detectors Based on Epitaxial ZnO Films Grown by MOCVD," Journal of Electronic Materials, vol. 29, No. 1, 2000, pp. 69–74, Piscataway, NJ.

* cited by examiner

METHOD OF FORMING A P-TYPE GROUP II-VI SEMICONDUCTOR CRYSTAL LAYER ON A SUBSTRATE

CROSS-REFERENCE TO RELATED APPLICATION

This patent application is a U.S. nonprovisional application filed pursuant to Title 35, United States Code §§ 100 et seq. and 37 C.F.R. Section 1.53(b) claiming priority under Title 35, United States Code § 119(e) to U.S. provisional application No. 60/391,507 filed Jun. 24, 2002 naming as inventors Jeffrey E. Nause, Joseph Owen Maciejewski, and Vincente Munne as inventors. Both the subject application and its provisional application have been or are under obligation to be assigned to the same entity.

STATEMENT OF GOVERNMENT RIGHTS IN THE INVENTION

This invention was made pursuant to a Small Business Innovative Research project funded by the U.S. Government as represented by the Office of Naval Research under Contract No. N00014-00-C-0362. The U.S. Government has certain rights in the invention.

BACKGROUND OF THE INVENTION

1. Field of the Invention

This invention relates to forming compound semiconductor layers using techniques such as metal-oxide chemical vapor deposition (MOCVD) or metal-oxide vapor phase epitaxy (MOVPE). More particularly, this invention relates to methods for forming magnesium, cadmium, and/or zinc oxide crystalline semiconductor layers useful for making electrical and electro-optical devices such as light emitting diodes (LEDs), laser diodes (LDs), field effect transistors (FETs), and photodetectors.

2. Description of the Related Art

For some time there has been interest in producing II-VI compound wide band gap semiconductors to produce green/blue LEDs, LDs and other electrical devices. Historically, attempts to produce these devices have centered around zinc selenide (ZnSe) or gallium nitride (GaN) based technologies. However, these approaches have not been entirely satisfactory due to the short lifetime of light emission that results from defects, and defect migration in these devices.

Recently, because ZnO has a wide direct bandgap of 3.3 electron-Volts (eV) at room temperature and provides a strong emission source of ultraviolet light, ZnO thin films on suitable supporting substrates have been proposed as new materials for LEDs and LDs. Undoped, as well as doped, ZnO films generally show n-type conduction. Impurities such as aluminum and gallium in ZnO films have been studied by Hiramatsu et al. who report activity as n-type donors (Transparent Conduction Zinc Oxide Thin Films Prepared by XeCl Excimer Laser Ablation, J. Vac. Sci. Technol. A 16(2), March/April 1998). Although n-type ZnO films have been available for some time, the growth of p-type ZnO films necessary to build many electrical devices requiring p-n junctions has been much slower in developing.

Minegishi et al. (Growth of P-Type ZnO Films by Chemical Vapor Deposition, Jpn. J. Appl. Phys. Vol. 36 Pt. 2, No. 11A (1997)) recently reported on the growth of nitrogen doped ZnO films by chemical vapor deposition and on the p-type conduction of ZnO films at room temperature. Minegishi et al. disclose the growth of p-type ZnO films on a sapphire substrate by the simultaneous addition of $NH_3$ in carrier hydrogen and excess Zn in source ZnO powder. When a Zn/ZnO ratio of 10 mol % was used, secondary ion mass spectrometry (SIMS) confirmed the incorporation of nitrogen into the ZnO film, although the nitrogen concentration was not precisely confirmed. Although the films prepared by Minegishi et al. using a Zn/ZnO ratio of 10 mol % appear to incorporate a small amount of nitrogen into the ZnO film and convert the conduction to p-type, the resistivity of these films is too high for application in devices such as LEDs or LDs. Also, Minegishi et al. report that the carrier density for the holes is $1.5 \times 10^{16}$ holes/cm$^3$, which is considered to be too low for use in commercial light emitting diodes or laser diodes.

Park et al. in U.S. Pat. No. 5,574,296 disclose a method of producing thin films on substrates by doping IIB-VIA semiconductors with group VA free radicals for use in electromagnetic radiation transducers. Specifically, Park et al. describe ZnSe epitaxial thin films doped with nitrogen or oxygen wherein ZnSe thin layers are grown on a GaAs substrate by molecular beam epitaxy. The doping of nitrogen or oxygen is accomplished through the use of free radical source which is incorporated into the molecular beam epitaxy system. Using nitrogen as the p-type dopant, net acceptor densities up to $4.9 \times 10^{17}$ acceptors/cm$^3$ and resistivities less than 15 ohm-cm were measured in the ZeSe film. However, the net acceptor density is too low and the resistivity is too high for use in commercial devices such as LEDs, LDs, and FETs.

White et al in U.S. Pat. No. 6,291,085 disclose a method for producing ZnO films containing p-type dopants, in which the p-type dopant is arsenic and the substrate is gallium arsenide (GaAs). The method of preparation of the film is laser ablation. However, the crystal quality of the films prepared by such a process is inferior and not suitable for device applications.

Although some progress has recently been made in the fabrication of p-type doped ZnO films which can be utilized in the formation of p-n junctions, a need still exists in the industry for ZnO films which contain higher net acceptor concentrations and possess lower resistivity values.

SUMMARY OF THE INVENTION

The invented method described herein overcomes the disadvantages noted above with respect to previous techniques for making p-type zinc oxide layers. This method can be used to make relatively high-quality light emitting diodes (LEDs), laser diodes (LDs), field effect transistors (FETs), and photodetectors, and other electrical, electro-optic, or opto-electrical devices.

Broadly stated, a method in accordance with the invention comprises forming a magnesium, cadmium, and/or zinc oxide ($Mg_{1-x-y}Cd_xZn_yO$; $0 \leq x < 1$, $0 < y \leq 1$, and x+y=0.1 to 1) II-VI Group compound semiconductor crystal layer with a p-type dopant uniformly incorporated into the layer, with said layer having relatively high crystal quality. The method can be implemented using metalorganic chemical vapor deposition (MOCVD) or metalorganic vapor phase epitaxy (MOVPE) techniques.

In one embodiment, the method for growing a p-type ZnO-based film, optionally with magnesium or cadmium, on a ZnO substrate can comprise cleaning a ZnO substrate. The cleaning can be performed to ensure that a ZnO film can be formed on the ZnO substrate with a reduced number of defects, and will also properly adhere to the substrate. The method can further comprise heating the substrate. The heating of the substrate causes the reaction gases containing magnesium, cadmium, and/or zinc and oxygen, and p-type dopant atoms, to bond and integrate with the substrate to form a relatively crystalline p-type semiconductor layer. The substrate can be heated to a temperature between 250 degrees celsius (C) and about 650 degrees C. The method can further comprise supplying reaction gases into a chamber containing the ZnO substrate. The reaction gases contain zinc and oxygen elements and p-type dopant atoms for forming the p-type ZnO layer. The p-type dopant gas can include one or more atomic elements from Groups IA, IB, VA and/or VB of the periodic table of the elements. For example, such element can include magnesium, cadmium, copper, arsenic, phosphorus, and others. The reaction gases can be admitted into the chamber at flow rates ranging from ten (10) to five-thousand (5000) standard cubic centimeters per minute (sccm). The method can comprise entraining one or more of the reaction gases into a flow of inert gas for delivery to the substrate's surface.

By supplying the reaction gases into the chamber containing the heated substrate, a p-type ZnO-based crystalline semiconductor layer can be grown with the method. The reaction forming the layer can be permitted to continue for sufficient time to produce a ZnO-based layer of a target thickness permitting formation of electrical or electro-optical devices therein.

The p-type ZnO-based layer produced by the disclosed method can be used in LEDs, LDs, FETs, and photodetectors, in which both n-type and p-type materials are required, as a substrate material for lattice matching to other materials in such devices, and/or as a layer for attaching electrical leads, among other possible uses.

Additional objects and advantages of the invention are set forth in the description which follows. The objects and advantages of the invention may be realized and obtained by means of the instrumentalities and combinations particularly pointed out in the appended claims.

BRIEF DESCRIPTION OF THE DRAWINGS

The accompanying drawings, which are incorporated herein and constitute a part of the specification, illustrate presently preferred embodiments of the invention, and together with the general description given above and the detailed description of the preferred embodiments given below, serve to explain the principles of the invention.

The invention is now described with reference to the accompanying drawings which constitute a part of this disclosure. In the drawings, like numerals are used to refer to like elements throughout the several views.

DETAILED DESCRIPTION OF THE PREFERRED EMBODIMENTS

The present invention is directed to a method of depositing a ZnO-based II-VI Group compound semiconductor crystal layer on a substrate by the metalorganic chemical vapor deposition or metalorganic vapor phase epitaxy technique. ZnO-based II-VI Group compound semiconductors include zinc oxide (ZnO), magnesium zinc oxide (MgZnO), cadmium zinc oxide (CdZnO), and magnesium cadmium zinc oxide (MgCdZnO). These semiconductors may be represented by the formula:

$Mg_{1-x-y}Cd_xZn_yO$, in which $0 \leq x < 1$, $0 < y \leq 1$, and x+y=0.1 to 1.

In the present invention, a reaction gas comprising a first organometallic gas containing zinc, and optionally also magnesium and/or cadmium, and a second gas containing oxygen, are supplied to the surface of the heated substrate surface. The substrate can comprise a bulk ZnO crystal chemically matched to the ZnO layer to be formed. A third dopant gas is also supplied to the heated surface to produce p-type conductivity by introducing dopant atoms into the ZnO layer as it grows. The ZnO-based II-VI Group compound semiconductor crystal grows on the heated substrate surface through the reaction of the first and second gas, and the p-type dopant is uniformly incorporated into the lattice of the crystal as it grows.

The first gas can be at least an organozinc compound such as diethylzinc, dimethylzinc or a mixture thereof. The first gas can further contain an organic compound of a Group III element, other than organogallium compounds. Examples of such an organic compound includes an organomagnesium compound such as bis(cyclopentadienyl)magnesium, bis(methylcyclopentadienyl)magnesium or a mixture thereof, or an organocadmium compound such as dimethylcadmium.

The second gas is oxygen which can react with the first gas to produce a layer of $Mg_{1-x-y}Cd_xZn_yO$ compound on the substrate.

The third gas contains a gaseous p-type dopant source, such as metalorganic or other precursors from Groups IA, IB, VA or VB from the period table of the elements. In the preferred embodiment, p-type dopant sources include bis(tetramethylheptanedianol)copper, arsine, phosphine, or tertiarybutylphosphine to introduce p-type dopant atoms copper, arsenic, and phosphorus, respectively, into the $Mg_{1-x-y}Cd_xZn_yO$ layer.

Figure 1:
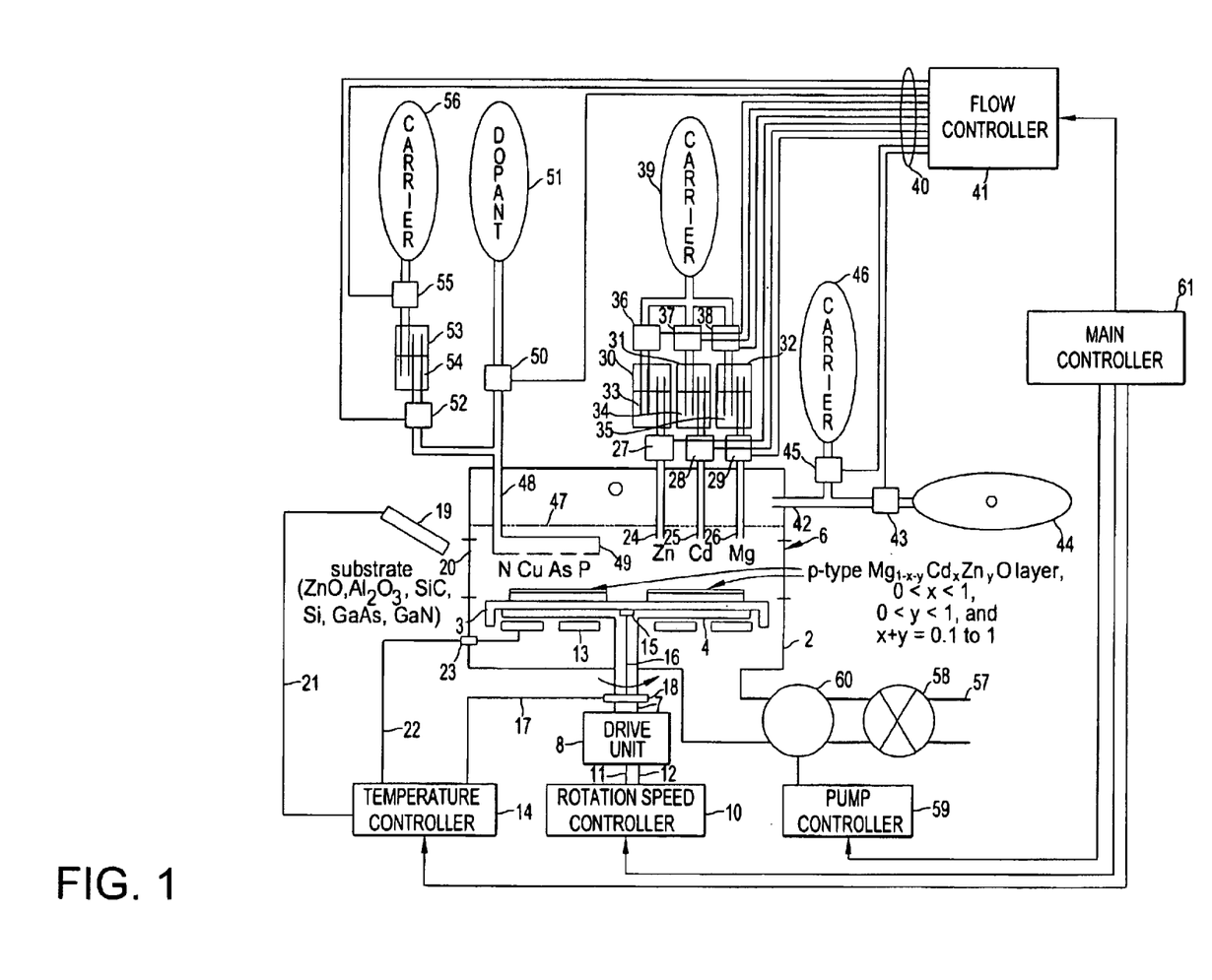
FIG. 1 shows an apparatus of the invention, which can be suitably used for the practice of the method of the present invention.

FIG. 1 schematically shows an apparatus 20 that can be used to perform the method of the present invention. As shown in FIG. 1, the apparatus 1 has a reaction chamber 2 made of, for example, stainless steel. A carrier plate 3 and susceptor 4 are arranged in the chamber 2 to place a substrate 5 thereon substantially horizontally. The substrate(s) 5 is loaded/unloaded through a load/unload port 6 arranged in the chamber 2, as is well known in the art. The susceptor 4 is a round column having a diameter of, for example, thirty (30) to one-hundred-fifty (150) millimeters (mm) and a height of, for example, ten (10) to thirty (30) mm. The carrier plate 3 and susceptor 4 are made of a high heat-resistant material which does not contaminate the gases in the chamber 2 upon heating. Such a material includes carbon surface-coated with silicon carbide.

A shaft 7 is fixed to the center of the lower surface of the susceptor 4, and air-tightly extends outside the chamber 2. The shaft 7 can be connected to and rotated by a drive unit 8, such as an electric motor or servo motor, to rotate the susceptor 4, and hence the carrier plate 3 and substrate 5, during the growth of an $Mg_{1-x-y}Cd_xZn_yO$ layer 9 on the respective substrate 5. The drive unit 8 is connected to the rotation speed controller 9 that regulates the rotation speed imparted by the drive unit 8 to the shaft 7 to maintain a target rotation speed. The target rotation speed can be constant, or alternatively, can be time-varying according to a predetermined rotation-speed-versus-time profile. In some implementations of the method, it can be desirable, for example, to set the rotation speed at a relatively slow rate at the beginning of the process of forming the $Mg_{1-x-y}Cd_xZn_yO$ layer(s) 9, speeding up to be relatively fast toward the end of the process of forming the layer. The controller 10 can be a computer that senses the rotation speed of the shaft 7. For example, the rotation speed can be sensed by a tachometer internal to the drive unit 8, which generates an electric signal indicating the rotation speed on conductive line 11. The rotation speed controller 10 senses the rotation speed, and subtracts it from the target rotation speed internally to the controller 10, to generate an error signal. As previously mentioned, the target rotation speed can be constant in which case it is time-invariant over the entire process. Alternatively, the target rotation speed corresponding to the time elapsed from the start of the timed process can be read from a target rotation speed profile, in which case the target speed for the elapsed time from commencement of the process is read by the controller 10 from its memory, and subtracted from the rotation speed signal, to generate the error signal. The rotation speed controller 10 uses the error signal to adjust the magnitude of the drive current to either speed, slow, or maintain the rotation speed, based on the error signal. The controller 10 supplies the adjusted drive current to the conductive line 12 to the drive unit 8 to drive the shaft 7 to rotate, thereby also rotating the susceptor 4 and carrier plate 3, to rotate the substrate(s) 5.

A heater 13 is arranged to heat the susceptor 4, and hence the carrier plate 3 and substrate 5, to a temperature suitable to grow the desired ZnO-based II-VI Group compound semiconductor crystal layer on the substrate, e.g., about 400 degrees C. or more. In FIG. 1, such the heater 13 is provided close to, but away from, the lower surface of the susceptor 4. The heater 13 can be an electrically-resistive element that is controlled to heat the susceptor 4 to the required temperature by a temperature controller 14 and a temperature sensor 15. The temperature sensor 15 can be incorporated in the susceptor 4. The temperature sensor 15 can be a thermistor, for example. The temperature sensor 15 generates an electric signal proportional to the temperature it senses. The sensor 15 is connected via electrically-conductive lines 16, 17 such as metal wires, and slip ring 18. Because the shaft 7 rotates relative to the temperature controller 14, slip ring 18 is connected between the wire 16 from temperature sensor 15 and a conductive wire 17 to temperature controller 14. Alternatively, an optical temperature sensor 19 can be arranged to view the substrate(s) 5 through transparent window 20 air-tightly sealed in the wall of chamber 2. The optical temperature sensor 15 generates the sensed temperature signal on line 21 that is supplied to the temperature controller 14. The temperature controller 14 can include an on/off control or supply current control, for example, that generates electric current based on the signal from the temperature sensor 15 or 17. The temperature controller 14 is connected to supply the electric current it generates to the heating element 13 via electrically-conductive line 22 which extends through bushing 23 in the wall of chamber 2. A user can set a target temperature with the temperature controller 14. Alternatively, if a user desires to vary the temperature of the substrate(s) 5 during the layer growth process, the user can set a target-temperature-versus-time profile to control the temperature of the substrate as a function of time during the layer growth process. If the temperature sensed by the sensor 15 or 17 is below the target temperature, the temperature controller 14 supplies electric current on the line 22 to the heating element 13 to increase the temperature of substrate(s) 5. Conversely, if the sensed temperature is at or above the target temperature, the temperature controller 14 does not generate electric current to permit the substrate(s) 5 to cool to the target temperature. The temperature sensor 15 or 17 and controller 14 thus function to maintain the temperature of the substrate(s) 5 and the respective layer(s) 9 growing thereon, at the target temperature during the growth process.

Injection tubes 24, 25, 26 extend through a wall of chamber 2, and are air-tightly sealed thereto. The injection tubes 24, 25, 26 can be arranged perpendicularly or transversely, to the substrate(s) 5 positioned on the carrier plate 5. Zinc-, cadmium-, and magnesium-containing reaction gases are blown through respective injection tubes 24, 25, 26 perpendicularly to the substrate surface, together with a carrier gas such as argon gas. More specifically, the injection tubes 24, 25, 26 can be connected to respective pressure flow controllers 27, 28, 29. The pressure flow controllers 27, 28, 29 are in turn connected to bubblers 30, 31, 32 containing respective liquid zinc-, cadmium-, and magnesium-organic compounds 33, 34, 35. The bubblers 30, 31, 32 are connected to respective mass flow controllers 36, 37, 38. The mass flow controllers 36, 37, 38 are connected through respective conduits to the tank 39 of carrier gas such as argon. The pressure and mass flow controllers 27, 28, 29, 36, 37, 38 can be electrically connected via lines 40 to the flow controller 41. The flow controller 41 can be implemented as a computer with an input device such as dials or keys permitting a user to set the pressure flow rates for controllers 27, 28, 29 and the mass flow rates for controllers 36, 37, 38. More specifically, the flow controller 41 controls the mass flow controllers 36, 37, 38 to regulate the amount of carrier gas permitted to pass into respective liquid zinc-, cadmium-, and magnesium-organic compounds 33, 34, 35 in the bubblers 27, 28, 29. Through bubbling in liquids 33, 34, 35, the carrier gas flows pick up vaporous zinc-, cadmium-, and magnesium-organic compounds for transport to respective pressure flow controllers 27, 28, 29. The flow controller 41 controls the pressure flow controllers 27, 28, 29 via lines 40 to regulate the pressures at which the respective zinc-, cadmium-, and magnesium-containing gases are introduced into the chamber 2.

To provide oxygen to form the p-type $Mg_{1-x-y}Cd_xZn_yO$ layer(s) 9 on respective substrate(s) 5, injection tube 48 is air-tightly sealed to the wall of chamber 2. The injection tube 42 is connected to a mass flow controller 43 which in turn is connected to a tank 44 of oxygen gas. The injection tube 42 can also be connected to a mass flow controller 45 which is in turn connected to tank 46 of carrier gas such as argon. The mass flow controllers 45 and 46 can be manually-set, or alternatively, can be electronically-controlled with the flow controller 41 via lines 40. The mass flow controllers 43, 45 can be used to generate a flow of carrier gas from tank 44, along with oxygen containing gas from tank 46, enters the chamber 2 through injection tube 42 and is uniformly distributed in a vertical flow towards the substrate 5 via a distribution plate 47. In FIG. 1, the distribution plate 47 extends horizontally across the chamber and partitions the upper portion of the chamber from its lower portion. The distribution plate 47 is positioned above the points of entry of other reaction gases into the chamber 2 to promote chemical reaction of gases at the surface of the substrate(s) 5 rather than in the upper part of the chamber away from the substrate(s). The distribution plate 47 has spaced holes defined therein to disperse the carrier and oxygen containing gases, and is positioned relative to the substrate(s) 5 so that the flow of carrier and oxygen-containing gas is directed vertically and thus transversely to the surface(s) of the substrate(s) 5 to promote the reaction forming the $Mg_{1-x-y}Cd_xZn_yO$ layer(s) 9 on the respective substrate(s). This oxygen-containing gas flow thus presses the reaction gases against the substrate(s) 5 where the reaction occurs.

An injection tube 48 is provided, and has an outer surface air-tightly sealed to the wall of chamber 2. The injection tube 48 can be used for separate injection of dopant or other reaction gases. The injection tube 48 extends through the dispersion plate 47 and can have a diffusion head 49 defining spaced holes to diffuse carrier and dopant gas received through tube 48. The diffusion head 43 diffuses and directs the carrier and dopant gas against the surfaces of the substrate(s) 5 to form the $Mg_{1-x-y}Cd_xZn_yO$ layer(s) 9 on the respective substrate(s) 5. If the dopant is gaseous, such as a nitrogen- or phosphorus-containing gas, the opposite end of the injection tube 42 can be connected to a mass flow controller 50 that is in turn connected to tank 51 which contains the dopant gas. Alternatively, if the dopant is in liquid form, such as a cadmium- or magnesium-containing volatile liquid, then the injection tube 48 can be connected to a pressure flow controller 52 which is in turn connected to a bubbler 53 containing the dopant-organic compound liquid 54. The bubbler 53 is connected to mass flow controller 55 which is in turn connected to tank 56 of carrier gas such as argon. The controllers 50, 52, 55 can be manually-set, or can be electronically-controller by the flow controller 41 via lines 40. In the case of use of a gaseous dopant, the flow controller 41 regulates flow through the mass flow controller 50 to a regulated level as set by a user. In the case of liquid dopant, the flow controller 41 controls the mass flow controller 55 to permit a regulated amount of carrier gas to pass through controller 55 to bubble in the liquid dopant compound 54 to generate dopant gas that passes at a pressure regulated by controller 41 via pressure flow controller 52 at a desired pressure through injection tube 48 and diffusion head 49 into the chamber 2.

It should be noted that the flow controller 41 can be such as to control the mass flow and pressure flow controllers 27, 28, 29, 36, 37, 38, 43, 45, 50, 52, 55 to produce constant mass and pressure flows, or alternatively, can vary one or more of such flows during the process of growing the p-type $Mg_{1-x-y}Cd_xZn_yO$ layer(s) 9 on the substrate according to a flow-versus-time profile stored in the memory of the controller 41 by a user.

At the lower portion of the chamber 2, an exhaust tube 57 is air-tightly sealed to the chamber 2. Gases inside the chamber 2 can be exhausted using an exhaust pump 58. The exhaust pump 58 can be manually-set to maintain a specified rate of exhausting of gases from the chamber 2. Alternatively, the exhaust pump 58 can be electronically-controlled via a pump controller 59. More specifically, the pump controller 59 receives a pressure signal on line 61 from butterfly valve 60 positioned in the exhaust tube 57. The pressure signal on line 61 indicates the pressure of the gases in the chamber 2. If the pressure of the chamber gases is at or below the target pressure set by a user in the pump controller 59, the pump controller 59 generates the pump signal on line 62 to control the pump 58 to slow the rate of exhausting of gases from the chamber. Conversely, if the sensed pressure is above the target pressure set in the pump controller 59, the pump controller 59 generates the pump control signal to cause the pump 58 to speed the rate of exhausting of gases form the chamber 2 to lower the gas pressure inside the chamber 2. The gas pressure within chamber 2 can thus be maintained at a regulated target pressure.

In a mass production environment, it can be desirable to provide the apparatus 1 with a main controller 61. The main controller 61 is connected to the rotation speed controller 10, the temperature controller 14, the flow controller 41, and the pump controller 59, and can be used to automatically activate or deactivate the such units to execute the process of forming the $Mg_{1-x-y}Cd_xZn_yO$ layer(s) 9 on respective substrate(s) 5.

A substrate 5 can be formed, for example, from a stoichiometric powder of elements comprising the target crystal composition with a gas overpressure using an apparatus and method such as that described in U.S. Pat. No. 5,900,060 issued May 4, 1999 to Jeffrey E. Nause et als., which is incorporated herein by reference. This patent is commonly assigned to the owner of this application, Cermet, Inc., Atlanta, Ga. For example, a ZnO powder can be used in this apparatus and method to produce a ZnO crystal with few or virtually no impurities or defects. The nature of this apparatus and method is such as to produce the crystal from a liquid phase that is contained by a cooler outer solid phase of the same material. After formation, the substrate is cut, polished, and cleaned with a suitable etchant or other chemical agent to produce a flat, defect- and contaminant-free surface on which the $Mg_{1-x-y}Cd_xZn_yO$ layer(s) 9 can be formed.

It is generally preferred that the substrate(s) 5 has crystalline structure with a lattice spacing closely matched to that of the $Mg_{1-x-y}Cd_xZn_yO$ layer(s) 9 to be formed thereon. This helps to lower the number of defects in the layer(s) 9 that would otherwise be caused by lattice mismatch. Thus, ZnO is most preferred compound for use as the substrate(s) 5 because of its close or exact match with the lattice structure of the $Mg_{1-x-y}Cd_xZn_yO$ layer(s) 9 to be formed thereon. However, this does not exclude the possibility of using other substrate compositions, such as sapphire ($Al_2O_3$), silicon carbide (SiC), silicon (Si), gallium arsenide (GaAs), and gallium nitride (GaN).

In operation of the apparatus 1, a substrate(s) 5 such as a zinc oxide (ZnO) substrate(s) is placed on the carrier plate 3, which is subsequently placed on the susceptor 4 through port 6. The susceptor 4 is heated with the heater 13 to a temperature of, for example, 250 degrees C. to 1050 degrees C. to heat the substrate 5 to that temperature. The heater 13 can be controlled by temperature controller 14 using a sensed temperature signal from either of temperature sensors 15, 19. The susceptor 4, and hence the carrier plate 3 and substrate 5, is rotated by driving the shaft 7 with drive unit 8. The drive unit 8 controller to rotate the substrate(s) 5 via shaft 7, susceptor 4, and plate 3 at a constant speed or according to a rotation-speed-versus-time profile that varies over time. The dopant, reaction, and carrier gases are supplied in the chamber 2 through respective injection tubes 24, 25, 26, 42, and 48 in a direction perpendicular, or at least transverse, to the substrate 5. The mass and pressure flows of the reaction gases can be set either manually or by using flow controller 41 to generate signals supplied to the controllers 27, 28, 29, 36, 37, 38, 43, 45, 50, 52, 55, to regulate the flows of dopant, reaction, and carrier gases into the chamber 2. Exhaust pump 58 controls the pressure of chamber gases to a target pressure level. This can be done by manual setting of the exhaust pump 58. Alternatively, the chamber pressure can be sensed using the butterfly valve 60 to generate a sensed pressure signal which the pump controller 59 uses to generate the pump control signal to control the pump 58 to maintain the chamber gas pressure to the target pressure level. The chamber pressure can be controlled via the exhaust pump 58 to maintain a pressure of five (5) to fifty (50) torrs of pressure during the layer growth operation. The exhaust pump 58 can control the chamber gas pressure to a constant target pressure throughout the layer growth operation, or alternatively, can vary the gas pressure in the chamber 2 according to a pressure-versus-time profile stored in the memory of the pump controller 59. Spinning of the susceptor 4 and the attached carrier plate 3 and substrate 5 converts the reaction gas flow to one essentially parallel with the surface(s) of substrate(s) 5. The reactants of the reaction gas react with each other to grow the desired ZnO-based II-VI Group compound semiconductor crystal layer on the entire substrate surface.

Figure 2:
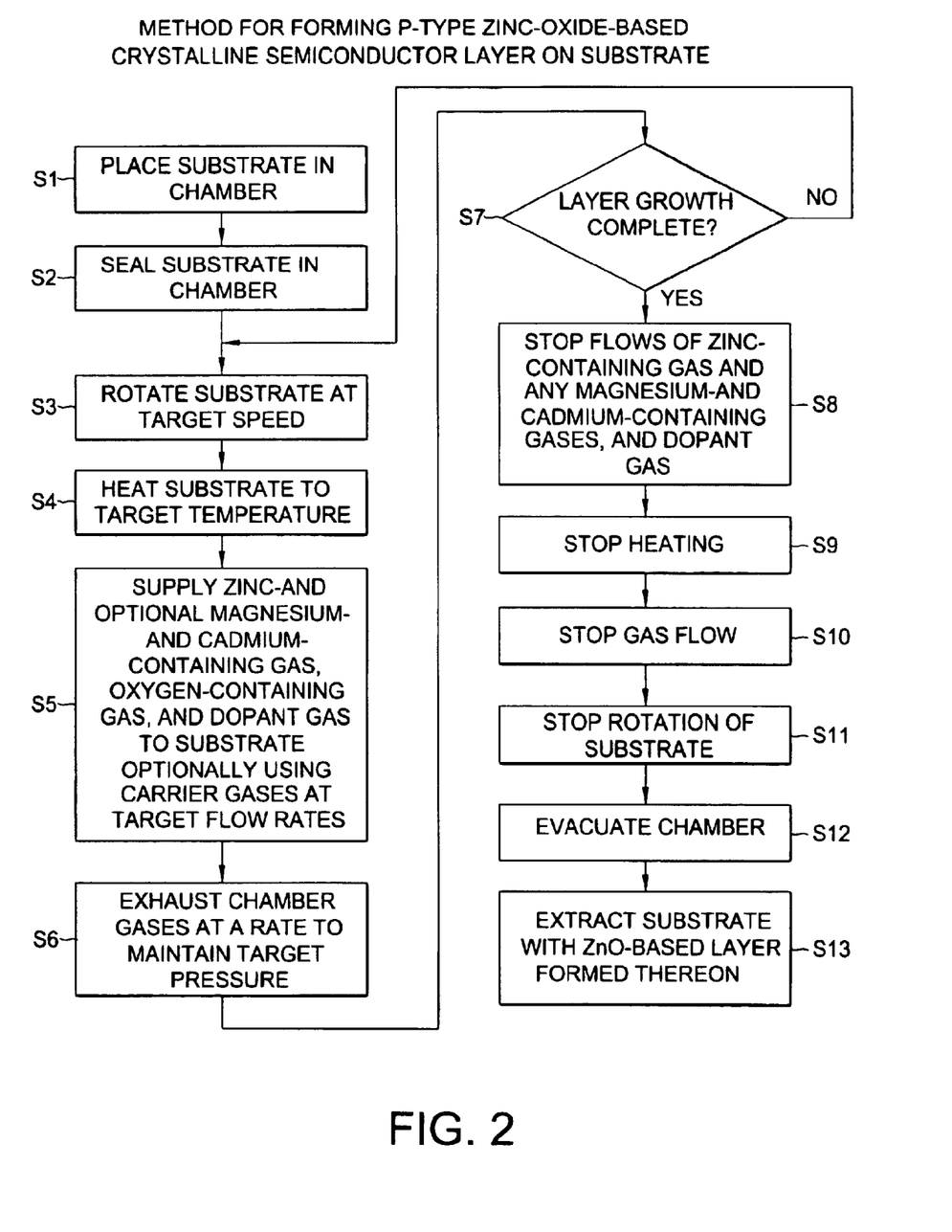
FIG. 2 is a flowchart of a method for producing a $Mg_{1-x-y}Cd_xZn_yO$ II-VI Group compound semiconductor crystal layer on a substrate in accordance with the invention.

In FIG. 2 a method for forming a p-type zinc-oxide-based crystalline semiconductor layer on a substrate(s) 5 begins in step S1 in which the substrate is placed in the chamber 2 through port 6. In step S2 the chamber 2 is sealed by closing port 6. In step S3 the substrate(s) 5 is rotated at speed from one-hundred (100) to one-thousand (1,000) rpm. This can be done by the drive unit 8 under control of the rotation speed controller 10. In step S4 the substrate(s) 5 is heated to a temperature in a range from two-hundred-fifty (250) to six-hundred-fifty (650) degrees C. This can be done with the heater 13. The substrate temperature can be sensed by the temperature sensor 15 or 19 for use by the temperature controller 14 to control the heater 13 to regulate the substrate temperature. In step S5 the zinc-containing reaction gas, optionally with magnesium- and cadmium-containing reaction gases, oxygen-containing gas, dopant gas, and any carrier gas used to transport the reaction and dopant gases, are supplied to the substrate(s) 5 to form the $Mg_{1-x-y}Cd_xZn_yO$ layer(s) 9 thereon. As previously described, the flows of gases can be produced and controlled by some or all of the injection tubes 24, 25, 26, 42, 48, dissipation plate 47, dissipation head 49, pressure flow controllers 27, 28, 29, 52, bubblers 30, 31, 32, 53, containing respective liquids 33, 34, 35, 54, mass flow controllers 36, 37, 38, 43, 45, 52, 55, and tanks 46, 39, 51, 56 containing respective gases. In step S6, during the process of growing the $Mg_{1-x-y}Cd_xZn_yO$ layer(s) 9, the gases are exhausted from the chamber 2 at a rate to maintain a target pressure of gases in the chamber 2. The target pressure can be set by a user via the exhaust pump 58 directly, or via a pump controller 59 which controls the exhaust pump 58 based on the pressure sensed by butterfly valve 60. In step S7 a determination is made to establish whether the growth of the $Mg_{1-x-y}Cd_xZn_yO$ layer(s) 9 is complete. This determination can be made using a timer (not shown) internal to the flow controller 41 or monitored by a user to establish whether a predetermined period of time has elapsed from start of growth of the layer(s) 9. By knowing the layer growth rate under the process parameters (e.g., reactant species, reactant mass flow and concentration, chamber pressure, substrate temperature, substrate spin rate, and reaction time) and the desired thickness of the substrate, the user can determine the amount of time necessary for the reaction to continue in order to grow the layer(s) 9 with the desired thickness. The present thickness standard for homogeneous p-type layer(s) 9 is at present one-hundred (100) microns for integration of electronic devices, but the layer thickness standard tends to be reduced over time as integrated device features become smaller due to improving integration technology. Alternatively, for electro-optic and opto-electric devices, because ZnO is inherently an n-type conductivity material, it is possible to make alternating p-type and n-type layers of a few nanometers to several nanometers thickness to produce an active layer stack for use as a LD or optical sensor, for example. This can be done merely by modifying the flow of p-type dopant gas to a level sufficiently high to produce a p-type layer of desired conductivity, and sufficiently low to produce a n-type layer of desired conductivity. If the determination in step S7 is negative, e.g., insufficient time has elapsed for the gases to form the layer(s) 9 to the desired thickness, then the process continues by repeat of steps S3 through and subsequent steps. The repeat of steps S3 through S8 can be performed with process parameters that remain static throughout the process. Alternatively, steps S3 through S8 can be performed using updated process parameters corresponding to the elapsed time from start of the process. Returning to consideration of step S7, if it is determined that growth of layer(s) 9 on substrate(s) 5 is complete, e.g., enough time has elapsed for the layer(s) to grow the desired thickness given the growth rate, in step S8 the flow of zinc-containing reaction gas, and optionally also magnesium- and cadmium-containing reaction gases, as well as the dopant gas, is halted. In step S9, the substrate(s) 5 and layer(s) 9 are permitted to cool to room temperature by cutting off electric current to the heater 13 using the temperature controller 14. In step S10 the flow of oxygen and carrier gases is stopped. This can be done after the substrate(s) 5 and layer(s) 9 have cooled to room temperature. In step S11 the rotation of the subtrate is stopped. In step S12 the chamber is evacuated using the exhaust pump 58. In step S13 the substrate(s) 5 and the $Mg_{1-x-y}Cd_xZn_yO$ layer(s) 9 thereon are extracted from the chamber 2. The $Mg_{1-x-y}Cd_xZn_yO$ layer(s) 9 of the substrate(s) 5 can then be used to form electrical, electro-optic, or opto-electric devices. One or more of steps S1 through S13 can be performed under control of the main controller 61 by activating and deactivating the controllers 10, 14, 41, 59 in accordance with the process parameters set for layer growth. The present invention will be described below by way of Examples which follow. In the following Examples, the apparatus of FIG. 1 was used to grow a ZnO-based II-VI Group compound semiconductor crystal layer on a zinc oxide substrate.

EXAMPLE 1

A p-type ZnO layer was grown on a ZnO substrate by the following steps.

1. Chemically cleaned, n-type ZnO single crystal substrates 5 of (002) crystallographic orientation were placed on the substrate carrier plate 3. This was then loaded onto the reactor susceptor 4 through port 6 and the chamber 2 sealed.

2. The chamber 2 was evacuated using the exhaust pump 58 to less than one-tenth (0.1) torr pressure.

3. A flow of three-thousand (3000) sccm argon and three-hundred (300) sccm oxygen was introduced into the chamber 2 through injection tube 42 via controllers 41, 43, 45, and tanks 44, 46 and the chamber pressure regulated to ten (10) torr with pump 58.

4. Meanwhile, the substrate susceptor temperature was increased to four-hundred (400) degree C. and rotation rate increased to six-hundred (600) revolutions per minute (rpm) in a period of sixty (60) minutes.

5. This state was maintained a period of time until the temperature of the susceptor stabilized at four-hundred (400) degrees C.

6. Diethylzinc vapor was introduced into the chamber at a rate of $1.4 \times 10^{-4}$ moles per minute (mol/min) entrained in an argon carrier flow of three-hundred-fifty (350) sccm using controllers 27, 36, 41, bubbler 30, and zinc-containing liquid 33.

7. Meanwhile, tertiarybutylphosphine 54 was introduced into the chamber at a rate of $1.5 \times 10^{-5}$ mol/min entrained in an argon flow of three-hundred-fifty (350) sccm using controllers 41, 52, 55, bubbler 53, and tank 56 of argon gas.

8. Meanwhile, the previous three-thousand (3000) sccm argon and three-hundred (300) sccm oxygen flows mentioned were maintained, and the chamber pressure was regulated at ten (10) torr.

9. This state was maintained for one (1) hour during growth of the films 9 on substrates 5.

10. Subsequently, all gas flows were halted except for one-thousand (1000) sccm argon carrier gas from tank 46 via controllers 41, 45, and three-hundred (300) sccm oxygen via controllers 41, 43 and tank 44. The chamber pressure was maintained at ten (10) torr.

11. The state of the system was maintained for sixty (60) minutes after deactivating the heater 13 with the temperature controller 14 while the substrates 5 cooled to near room temperature.

12. All gas flows were halted, and the chamber 2 was evacuated using the exhaust pump 58 to less than one-tenth (0.1) torr.

13. The chamber was then vented with atmosphere, and the substrates were removed.

EXAMPLE 2

MgZnO alloy films were grown on ZnO substrates by the following steps.

1. Chemically cleaned, n-type ZnO single crystal substrates 5 of (002) crystallographic orientation were placed on the substrate carrier plate 3. This was then loaded onto the reactor susceptor 4 and the chamber 2 sealed.

2. The chamber 2 was evacuated using the exhaust pump 58 to less than one-tenth (0.1) torr pressure.3. A flow of three-thousand (3000) sccm argon and three-hundred (300) sccm oxygen was introduced into the chamber 2 through injection tube 42 via controllers 41, 43, 45, and tanks 44, 46 and the chamber pressure regulated to ten (10) torr with pump 58.4. Meanwhile, the substrate susceptor temperature was increased to four-hundred (400) degree C. using heater 13, temperature sensor 15 or 19, and temperature controller 14, and rotation rate increased to six-hundred (600) rpm in a period of sixty (60) minutes. This state was maintained a period of time until the temperature of the susceptor 4 stabilized at four-hundred (400) degree C.

3. Diethylzinc vapor was introduced into the chamber at a rate of $2.9 \times 10^{-5}$ mol/min entrained in an argon carrier flow of three-hundred-fifty (350) sccm using controllers 27, 36, 41, bubbler 30, and zinc-containing liquid 33.

4. Meanwhile, bis(methylcyclopentadienyl)magnesium vapor was introduced into the chamber 2 via controllers 29, 38, 41, bubbler 32, magnesium-containing liquid 35, and tank 39 of argon carrier gas 41, at a rate of $5.8 \times 10^{-6}$ mol/min entrained in an argon carrier flow of three-hundred-fifty (350) sccm.

5. Meanwhile, the previous three-thousand (3000) sccm argon and three-hundred (300) sccm oxygen flows mentioned were maintained with units 42–47, and the chamber pressure was regulated at ten (10) torr with exhaust pump 58.

6. This state was maintained for ninety (90) minutes during growth of the films.

7. Subsequently, all gas flows were halted except for one-thousand (1000) sccm argon carrier gas from tank 46 via controllers 41, 45 and three-hundred (300) sccm oxygen via controllers 41, 43 and tank 44. The chamber pressure was maintained at ten (10) torr by exhaust pump 58.

8. The state of the system was maintained for sixty (60) minutes after deactivating the heater 13 using the temperature controller 14 while the substrates cooled to near room temperature.

9. All gas flows were halted, and the chamber 2 was evacuated using the exhaust pump 58 to less than one-tenth (0.1) torr.

10. The chamber 2 was then vented with atmosphere, and the substrates 5 were removed through port 6.

Due to the fact that the substrate and $Mg_{1-x-y}Cd_xZn_yO$ layer grown thereon are relatively pure and are closely matched in their crystalline lattice spacing, as well as the activation of a large number of dopant atoms in the layer, net acceptor concentration within the layer is relatively high and resistivity is relatively low as compared to layers produced with previous methods. For example, it is possible to produce layers with net acceptor concentrations of at least $10^{17}/cm^3$ and resistivities of at least one-tenth (0.1) Ohmcm. Hence, the methods disclosed herein are useful for generating relatively high-performance, commercially-viable devices such as LEDs, LDs, and FETs.

Although the methods of the invention have been described herein with reference to specific embodiments and examples, it is not necessarily intended to limit the scope of the invention to the specific embodiments and examples disclosed. Thus, in addition to claiming the subject matter literally defined in the appended claims, all modifications, alterations, and equivalents to which the applicant is entitled by law, are herein expressly reserved by the following claims.

What is claimed is:

1. A method of depositing a zinc oxide-based II-VI Group compound semiconductor crystal layer over a substrate by a metalorganic chemical vapor deposition technique, comprising:

heating the substrate; and supplying reaction gases comprising a first gas containing a zinc compound, a second gas containing oxygen, a third p-type dopant gas with at least one element from one of Groups IA, IB, VA and VB of the periodic table of the elements, and a fourth inert carrier gas used to carry the reaction gases to the surface of the heated substrate to grow the zinc-oxide-based II-VI Group compound semiconductor crystal layer on the substrate.

2. A method as claimed in claim 1 wherein at least one of the gases is directed in a flow transverse to the substrate to carry the reaction gases to the substrate to form the layer.

3. A method as claimed in claim 1 wherein the heating and supplying is performed in a chamber.

4. A method as claimed in claim 1 wherein the temperature of the substrate is maintained at a temperature in a range from two-hundred-fifty (250) to six-hundred-fifty (650) degrees Celsius during growth of the layer.

5. A method as claimed in claim 1 wherein the heating is performed by a heater comprising an electrically-resistive element.

6. A method as claimed in claim 1 wherein the substrate is maintained at a target temperature by a temperature controller and temperature sensor.

7. The method according to claim 1 wherein the II-VI Group compound semiconductor is represented by the formula ZnO.

8. The method of claim 7 wherein the substrate comprises zinc oxide (ZnO).

9. The method of claim 1 wherein the substrate has an (002) crystallographic orientation.

10. The method of claim 1 wherein the first gas contains zinc, and optionally magnesium and cadmium, to form a II-VI Group compound semiconductor represented by the formula $Mg_{1-x-y}Cd_xZn_yO$, in which $0 \leq x < 1$, $0 < y \leq 1$, and x+y=0.1 to 1.

11. The method of claim 1 wherein the substrate is represented by the formula ZnO.

12. The method of claim 11 wherein the ZnO substrate is produced by an apparatus that contains liquid-phase ZnO in a solid-phase ZnO "skull" during growth of the crystal from which the ZnO substrate is formed.

13. The method of claim 1 wherein the substrate is selected from the group consisting of zinc oxide (ZnO), sapphire ($Al_2O_3$), silicon carbide (SiC), silicon (Si), gallium arsenide (GaAs), and gallium nitride (GaN).

14. The method of claim 1 wherein the zinc compound in the first gas comprises diethylzinc, dimethylzinc, or a mixture thereof.

15. The method according to claim 1, wherein said first gas further comprises magnesium metalorganic, cadmium metalorganic or a mixture thereof.

16. The method of claim 1 wherein the oxygen in the second gas comprises oxygen ($O_2$) or nitrous oxide ($N_2O$).

17. The method of claim 1 wherein the third p-type dopant gas comprises at least one of nitrogen (N), copper (Cu), arsenic (As), and phosphorus (P).

18. The method of claim 1 wherein the third p-type dopant gas is selected from the group consisting of bis (tetramethylheptanedianol)copper, arsine, phosphine, or tertiarybutylphosphine.

19. The method of claim 1, wherein said inert carrier gas comprises argon gas.

20. The method of claim 1 wherein the gas flow rates are maintained at from ten (10) to five-thousand (5000) standard cubic centimeters per minute (sccm) during growth of the layer.

21. The method of claim 20 wherein the gas flow rates are maintained by mass flow controllers.

22. The method of claim 1 wherein the gases are maintained under a pressure in a range from five (5.0) to fifty (50.0) torr during growth of the layer.

23. The method of claim 22 wherein the gases are maintained under pressure by an exhaust pump which controls the rate of exit of the gases from a chamber in which the substrate is situated during growth of the layer.

24. The method of claim 23 wherein the pressure of the gases is further maintained by pressure flow meters.

25. The method of claim 1 wherein the substrate is rotated at a rate in a range from one-hundred (100) to one-thousand (1,000) revolutions per minute (rpm) during growth of the layer.

26. The method of claim 25 wherein the substrate is rotated by a drive unit connected to a shaft that turns a susceptor and carrier plate upon which the substrate is situated during growth of the layer.

27. The method of claim 1 wherein the acceptor concentration of the zinc-oxide-based II-VI Group compound semiconductor crystal layer produced by the method is at least $10^{17}$ atoms per cubic centimeter.

28. The method of claim 1 wherein the resistivity of the zinc-oxide-based II-VI Group compound semiconductor crystal layer produced by the method is at least one-tenth (0.1) Ohm-centimeter.

* * * * *

UNITED STATES PATENT AND TRADEMARK OFFICE
CERTIFICATE OF CORRECTION

PATENT NO. : 6,887,736 B2
DATED : May 3, 2005
INVENTOR(S) : Nause et al.

It is certified that error appears in the above-identified patent and that said Letters Patent is hereby corrected as shown below:

Drawings,
Sheet 1 should be deleted to be substituted with the attached sheet 1, as shown on the attached page.

Column 12,
Line 28, "A method of depositing a zinc oxide-based" should read -- A method of depositing a p-type zinc oxide-based --;
Line 39, "grow the zinc-oxide-based" should read -- grow the p-type zinc-oxide based --;
Line 56, "claim 1 wherein the II-VI Group" should read -- claim 1 wherein the p-type II-VI Group --;
Line 64, "to form a II-VI Group" should read -- to form the p-type II-VI Group --.

Column 13,
Lines 14 and 26, after "claim 1" cancel the comma ",".

Column 14,
Line 23, "of the zinc-oxide-based" should read -- of the p-type zinc-oxide-based --;
Line 26, "wherein the resistivity" should read -- wherein the p-type resistivity --.

Signed and Sealed this

Sixteenth Day of August, 2005

JON W. DUDAS
*Director of the United States Patent and Trademark Office*

FIG. 1